(12) United States Patent
Ryu et al.

(10) Patent No.: US 6,594,298 B2
(45) Date of Patent: Jul. 15, 2003

(54) MULTI-WAVELENGTH SEMICONDUCTOR LASER ARRAY AND METHOD FOR FABRICATING THE SAME

(75) Inventors: Sang-Wan Ryu, Taejon (KR); Je Ha Kim, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 10/003,294

(22) Filed: Dec. 6, 2001

(65) Prior Publication Data

US 2002/0181532 A1 Dec. 5, 2002

(30) Foreign Application Priority Data

May 31, 2001 (KR) .................................. 2001-30466

(51) Int. Cl.[7] .............................................. H01S 3/19
(52) U.S. Cl. .................................. 372/50; 372/102
(58) Field of Search ............................................ 372/50

(56) References Cited

U.S. PATENT DOCUMENTS

| | | | | |
|---|---|---|---|---|
| 4,972,238 A | * | 11/1990 | Tanaka ........................ | 372/45 |
| 5,071,786 A | * | 12/1991 | Paoli ........................... | 438/35 |
| 5,289,494 A | * | 2/1994 | Tada et al. ..................... | 372/96 |
| 5,325,392 A | * | 6/1994 | Tohmori et al. ............... | 372/96 |
| 5,329,542 A | * | 7/1994 | Westbrook .................... | 372/96 |
| 5,784,183 A | | 7/1998 | Aoki et al. | |

OTHER PUBLICATIONS

Lee, et al.; *Monolithically Integrated Multiwavelength . . .* ; IEEE Journal of Selected Topic in Quantum Electronics, vol. 6, No. 1, Jan./Feb. 2000, pp. 197–206.

Katoh, et al.; *DBR Laser Array for WDM System*; Electronics Letters, Dec. 9, 1993, vol. 29. No. 25, pp. 2195–2197.

Aoki, et al.; *Detuning Adjustable Multiwavelength MQW–DFB . . .* ; IEEE Photonics Technology Letters, vol. 6, No. 7, Jul. 1994, pp. 789–791.

Ketelsen, et al.; *Multiwavelength DFB Laser Array With Spot Size Converters*; IEEE Journal of Quantum Electronics, vol. 36, No. 6, Jun. 2000, pp. 641–648.

Pezeshki, et al.; *12nm Tunable WDM Source Using an Integrated Laser Array*; Electroncs Letters Apr. 27th 2000; vol. 36, No. 9, pp. 788–789.

\* cited by examiner

*Primary Examiner*—Paul Ip
*Assistant Examiner*—Dung T Nguyen
(74) *Attorney, Agent, or Firm*—Jacobson Holman PLLC

(57) ABSTRACT

A laser resonator is implemented by using the –1-st order reflection peaks of a sampled grating so that the multi-wavelength single mode light source array can be manufactured easily and economically. A multi-wavelength semiconductor laser array comprises a substrate; a plurality of laser stripes arranged with a predetermined space on the substrate, each being divided into two sections; a multiplicity of asymmetric sampled gratings distributed with sampling periods different from each other on the bottom of each active layer; and a number of effective refractive index changing layers, each arranged on one section of each laser stripe to make the Bragg wavelengths different at the two sections.

6 Claims, 6 Drawing Sheets

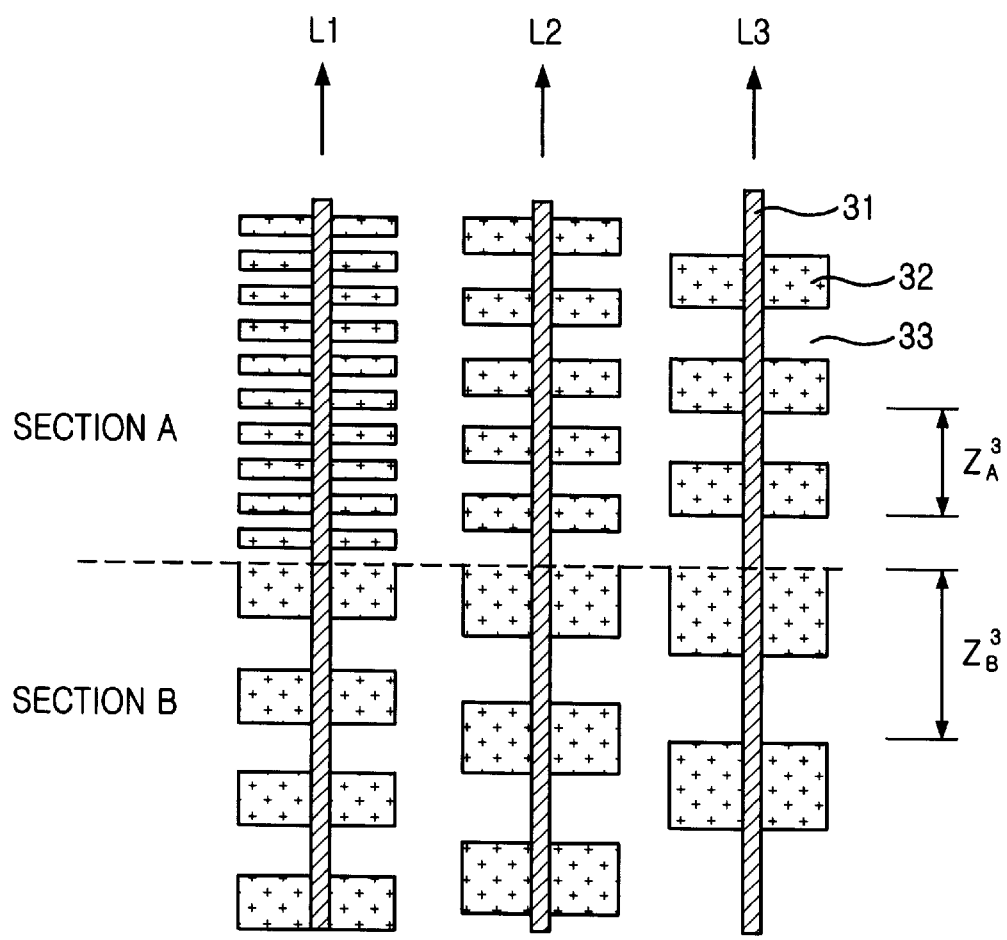

MULTI-WAVELENGTH SEMICONDUCTOR LASER ARRAY AND METHOD FOR FABRICATING THE SAME

FIELD OF THE INVENTION

The present invention relates to a light source for a wavelength division multiplexing optical communication system, and, more particularly, to a multi-wavelength single mode laser using sampled grating and a method for fabricating the same.

PRIOR ART OF THE INVENTION

Recently, as a scheme for increasing transmission capacity to meet with the tremendous amount of information transferred via communications, optical data transmission by wavelength division multiplexing (WDM) is used.

In the WDM system, optical signals whose wavelengths (channels) are different from each other are transferred through an optical fiber by using non-interferential property of light so that the transmission capacity can be increased. The WDM scheme has an advantage in ensuring expansibility and flexibility of the optical communication system. Especially, in construction of optical subscriber network such as ATM-PON and etc., the WDM method is considered as more economical than a time division multiplexing (TDM) method.

As a light source for such a WDM system, a multi-wavelength distributed feedback (DFB) laser array seems most potent because of its good single mode characteristics (side-mode suppression ratio higher than 30 dB). The multi-wavelength light source may be realized by combining discrete DFB lasers externally. However, it will be more desirable to fabricate the multi-wavelength DFB laser array on a single substrate for economic reasons.

The DFB laser comprises a wavelength selective diffraction grating in its structure. The oscillation wavelength $\lambda$ of the laser is determined by the grating period $\Lambda$ of the diffraction grating and an effective refractive index $n_{eff}$ of a waveguide as follows:

$$\lambda = 2 n_{eff} \Lambda \qquad \text{Eq.(1)}$$

As shown in Eq.(1), in order to implement the multi-wavelength laser array, there are provided a method for implementing diffraction gratings having different periods from each other on a single substrate and another method for adjusting the effective refractive indexes with the same grating period.

Firstly, the method of implementing diffraction gratings with different periods is considered. There are several ways of grating fabrication for a conventional DFB laser. Usually typical photolithography cannot be used because the grating period is as small as around 240 nm, which is beyond the resolution of it. Therefore, in order to manufacture the diffraction grating, e-beam lithography, holographic interference exposure, and a phase mask are currently in use.

However, they have problems for the application to a multi-wavelength laser array. Among them, the holographic interference exposure scheme is not proper for manufacturing the multi-wavelength light source, because it forms the diffraction gratings having same periods on the full surface of a wafer. The E-beam lithography scheme is expensive and time-consuming so that it is not proper for mass production. The phase mask scheme seems not to easily implement because it is not easy to form the phase mask.

On the other hand, an attempt for fabricating the array of the multi-wavelength DFB laser through the change of effective refractive index is realized by selective area crystal growth. In the selective area growth, dielectric thin film is deposited on a semiconductor substrate and, then, the dielectric thin film is selectively removed to form a mask pattern. At this time, thickness of a grown layer can be controlled by mask width and distance between the masks, which can be used to change the effective refractive index of a laser on the same wafer.

In "Detuning adjustable multi-wavelength MQW-DFB laser array grown by effective index/quantum well energy control selective area MOVPE", M. Aoki and et al., IEEE Photonic technology letters, vol.6, No.7, pp.789–791, July 1994, there is shown that the wavelength of the DFB laser that is fabricated by this technique can be changed by around 10 nm.

Also, U.S. Pat. No. 5,784,183 issued to the same author in 1998 shows the wavelength change of 30 nm.

However, if thickness difference increases too much by the selective area crystal growth, problems as follow could happen. As the mask width increases and the space between the masks decreases in order to enhance the thickness difference, optical characteristic of a quantum well deteriorates. Furthermore, InGaAsP composition of a laser active layer varies with the thickness enhancement so that strain is incorporated in the grown layer. When the amount of strain is too high, the laser characteristic is deteriorated because of the generation of dislocations.

Because of such problems, change of the waveguide thickness is limited and, as a result, the laser wavelength cannot be changed sufficiently. Therefore, wide wavelength range required in the optical subscriber network cannot be obtained and the system expansibility is limited.

On the other hand, separately from the above techniques, a method for implementing the multi-wavelength laser array by using a sampled grating in "Monolithically integrated multiwavelength sampled grating DBR lasers for dense WDM applications", S. L. Lee, IEEE J.Selected Topics on Quantum Electron, vol.6, No.1, pp.197–206, January 2000. In this structure, the sampled grating substitutes for the diffraction grating in a mirror area of a distributed Bragg reflector (DBR) laser and wavelengths are selected by current injection.

However, because a laser resonator is divided into 4 or 5 sections and current should be injected to the sections separately, procedure and device operation are very complex. Also, since device length is typically long, quantum efficiency or output optical characteristic is deteriorated compared with a typical DBF laser.

As described above, in the conventional techniques, there are problems in that complex and time consuming procedure is used to fabricate the DFB laser array required for the optical subscriber network or the fabricated laser array does not cover sufficient wavelength range.

Therefore, there is a need for a new structure or a method to overcome the shortages of the conventional techniques, for the light source for the WDM optical subscriber network.

SUMMARY OF THE INVENTION

Therefore, it is an object of the present invention to provide a structure and a method for manufacturing a multi-wavelength laser array easily and economically by using a sampled grating.

In accordance with an aspect of the present invention, there is provided a multi-wavelength semiconductor laser array comprising a substrate; a plurality of laser stripes arranged with a predetermined space on the substrate, each being divided into two sections; a multiplicity of asymmetric sampled gratings having different sampling periods from each other on the bottom of each active layer; and a number of effective refractive index changing layers, each arranged on one section of each laser stripe to make Bragg wavelengths different at the two sections.

Preferably, the asymmetric sampled grating has sampling periods to make the −1-st order or +1-st order reflection wavelengths at both sections of the ASG laser cavity match with each other.

In accordance with another aspect of the present invention, there is provided a method for fabricating a multi-wavelength semiconductor laser array, comprising the steps of: (a) forming a multiplicity of diffraction gratings having the same period on a substrate; (b) forming asymmetric sampled gratings having sampling periods different from each other by periodically removing some parts of the diffraction gratings; (c) forming active layers on the asymmetric sampled gratings; (d) forming effective refractive index changing layers for one of the two sections.

BRIEF DESCRIPTION OF THE DRAWINGS

The above and other objects and features of the present invention will become apparent from the following description of preferred embodiments taken in conjunction with the accompanying drawings, in which:

FIG. 3 offers a diagram of an asymmetric sampled grating single mode laser array in accordance with an embodiment of the present invention;

PREFERRED EMBODIMENT OF THE INVENTION

Firstly, the unique reflectance characteristics of a sampled grating is described in order to understand a operation principle of a single mode laser using asymmetric sampled gratings in accordance with the present invention.

Typically, reflectance characteristic of a laser cavity is a critical factor for a laser operation, when the laser has diffraction grating in the structure, such as the laser oscillation wavelength and the single mode characteristic. For example, a laser having wide gain bandwidth like a semiconductor laser allows lasing operation to occur at the wavelength where the effective reflectance is the highest. Also, the single mode characteristic is determined by the difference of the effective reflectance between main mode and the other modes. Now, the unique reflectance characteristics of the sampled grating will be discussed because the present invention is based on it.

Figure 1A:
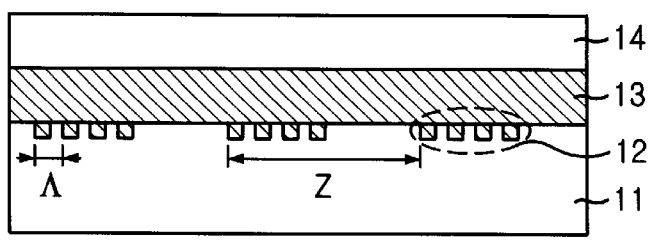
FIG. 1A shows a conceptual diagram of a typical sampled grating.

Referring to FIG. 1A, there is provided a typical sampled grating inserted between an n-InP substrate 11 and a waveguide layer 13. Then, an InP cladding layer 14 is grown on the waveguide layer 13. Basically the sampled grating is a periodic structure of gratings separated by no-grating region. The sampling period is Z and is usually much larger than the grating period Λ.

As shown in FIG. 1A, the diffraction grating is repeated with a certain periodicity and shows a unique reflectance curve when compared to a typical distributed feedback (DFB) laser in which the diffraction gratings exist over the full area of the substrate.

As shown in Eq.(1), when there exists diffraction gratings over the full area of the substrate, a reflection peak exists only at the Bragg wavelength.

Figure 1B:
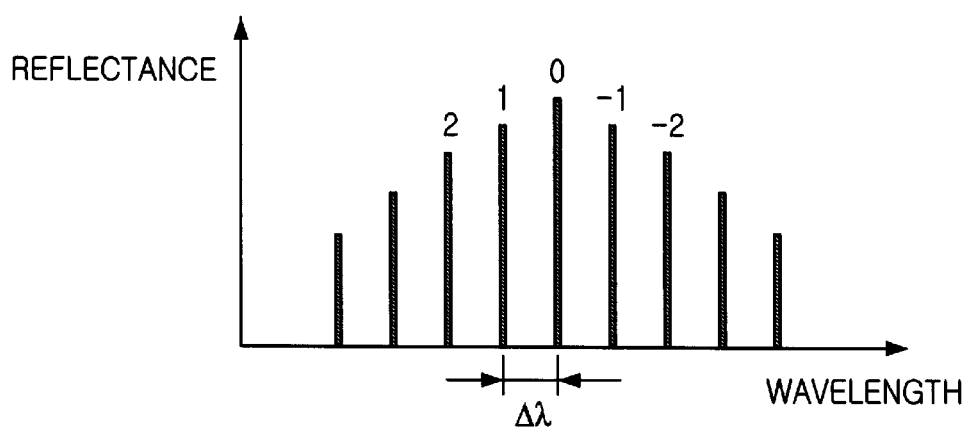
FIG. 1B is a reflectance curve of a waveguide structure including the sampled grating (SG) as shown in FIG. 1A.

However, upon forming the sampled grating, Bragg reflection from the diffraction grating is diffracted by the sampled grating so that a number of reflection peaks are located near the Bragg wavelength. At this time, the wavelength spacing $\Delta\lambda$ between the reflection peaks is determined by the sampling period Z of the sampled grating as in Eq.(2), $$\Delta\lambda = \frac{\lambda^2}{2n_{eff}Z} \qquad \text{Eq. (2)}$$

where Z is the sampling period. Referring to FIG. 1B, there is provided a diagram of the reflection peaks from the sampled grating.

Usually, it is not easy to change the Bragg wavelength on the single substrate because the grating period Λ is too small to be well controlled. However, the wavelength of higher (−1-st or +1-st) order reflection peak is more controllable because it is determined by the Bragg wavelength and the sampling period Z of the sampled grating.

Typically, since the sampling period Z of the sampled grating is several $\mu$m to several tens of $\mu$m, the conventional photolithography is enough to adjust the sampling period Z on a single substrate. Accordingly, the laser array can be implemented easily if the laser is operated by using the −1-st or +1-st order reflection peak for lasing operation.

Figure 2A:
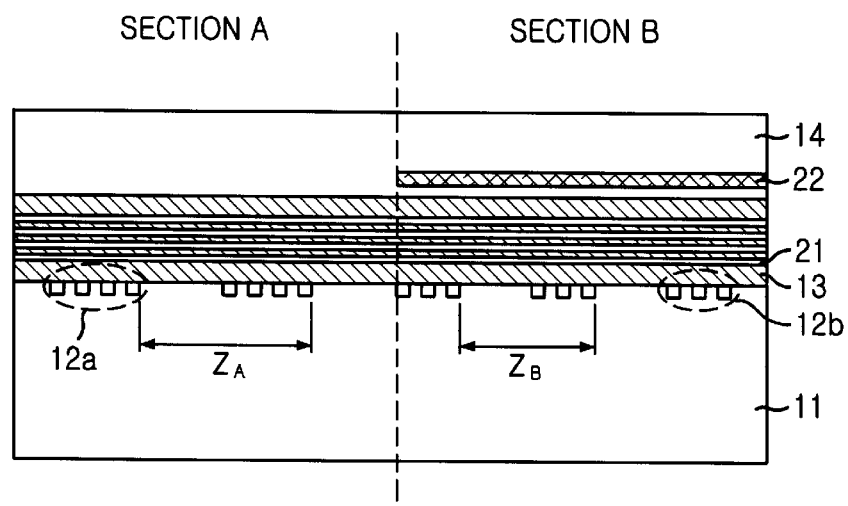
FIG. 2A shows a conceptual diagram of an asymmetric sampled grating (SG) single mode laser in accordance with an embodiment of the present invention.

FIG. 2A shows an asymmetric sampled grating laser structure in accordance with an embodiment of the present invention, which includes an active layer 21, asymmetric sampled gratings 12a, 12b, and an effective refractive index changing layer 22. A laser stripe is arranged with a predetermined space on the substrate 11 and divided into two sections A, B. The asymmetric sampled gratings 12a, 12b are formed with different sampling periods at the two sections beneath the active layer 21. The effective refractive index changing layer 22 is arranged on one section of the laser stripe so as to make the Bragg wavelengths different at the two sections.

Here, the sampled grating 12a that is formed at the section A has a sampling period of $Z_A$ and the sampled grating 12b that is formed at the section B has a sampling period of $Z_B$.

Because laser oscillation at the Bragg wavelength should be suppressed, the effective refractive index changing layer 22 is formed on top of the active layer 21 in the section B. As a result, the effective refractive index of the section A is made to be different from that of the section B and the Bragg wavelengths of the two sections A, B are not the same with each other. Such variation of effective refractive index of a waveguide is accomplished by thickness change of the waveguide by performing selective etching of the waveguide or the selective area growth.

Figure 2B:
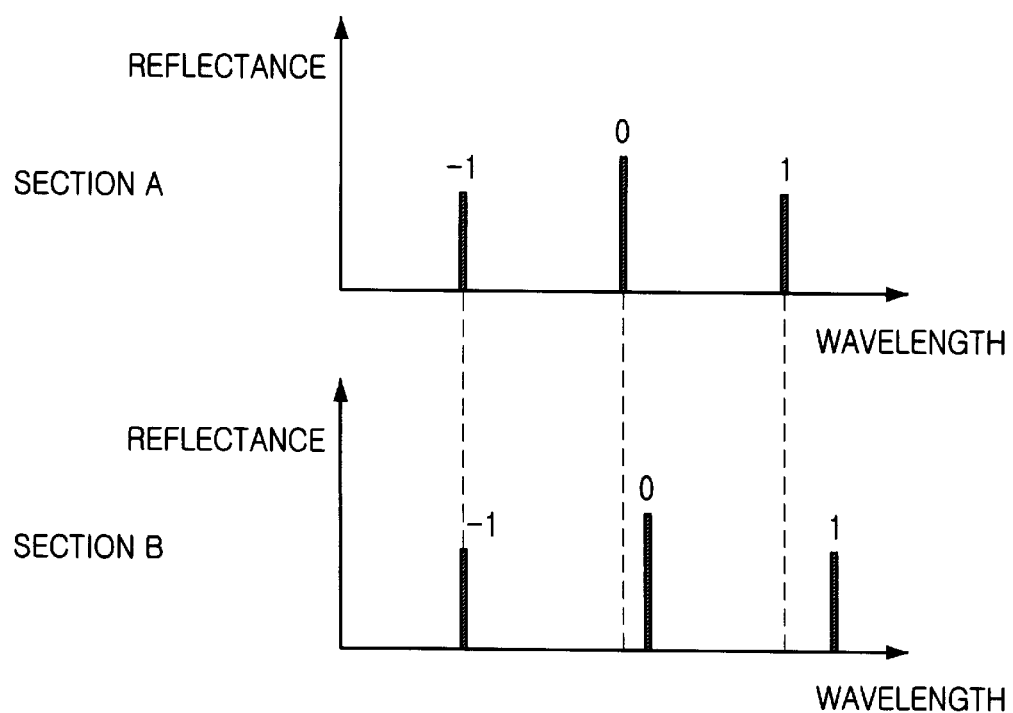
FIG. 2B shows reflectance curves for sections A and B within the laser as shown in FIG. 2A.

As shown in FIG. 2B, the different Bragg wavelengths are considered to adjust the sampling periods of the sampled gratings. By matching the wavelengths of the −1-st order reflection peaks at both sections, lasing operation can be controlled to occur at this wavelength.

As described above, by using the −1-st order reflection peak, the multi-wavelength laser array can be fabricated by changing the sampling periods of each laser in the laser array.

Referring to FIG. 3, operation principle of the asymmetric sampled grating laser array will be described.

FIG. 3 is a plane diagram of the laser array in accordance with an embodiment of the present invention, which has three lasers L1, L2, L3, each having a wavelength different from others.

As a specific example to clarify the embodiment of this invention, the array with center wavelength of 1550 nm and wavelength spacing of 3.2 nm (400 GHz) is considered. In this case, the lasing wavelength of the first laser L1 is 1546.8 nm, the second laser L2 of 1550 nm, and the third laser L3 of 1553.2 nm. The reference number 31 denotes the laser stripes, and 32 and 33 denote grating region and no-grating region of sampled gratings, respectively.

At first, the diffraction gratings, which have the period of 240 nm, are formed on the overall area of the substrate by the typical holographic interference method. Then, the sampled gratings are formed by selectively removing the diffraction gratings and the laser active layer and the effective refractive index changing layer are grown on them.

For example, as the effective refractive index changing layer, InGaAsP(Eg-1.13 eV) of 0.1 $\mu$m thickness is grown and then selectively removed in the section A. In this case, because of the change of the effective refractive index, the Bragg wavelength at the section A becomes 1.565 $\mu$m and the Bragg wavelength at the section B becomes 1.56 $\mu$m.

At this time, for operation of the first laser L1, the −1-st order reflection peak at both of the two sections A and B should exist at 1546.8 nm wavelength.

Using Eq.(1) and Eq.(2), $Z_A^1$ (the sampling period of the sampled grating of the first laser in the section A)=19 $\mu$m and $Z_B^1$ (the sampling period of the sampled grating of the first laser in the section B)=26 $\mu$m. Therefore, the sampled gratings should have periodicity as described above during the prescribed sampled grating forming procedure.

Similarly, for the second laser L2, $Z_A^2$=24 $\mu$m and $Z_B^2$=36 $\mu$m and, for the third laser L3, $Z_A^3$=29 $\mu$m and $Z_B^3$=46 $\mu$m.

Figure 4:
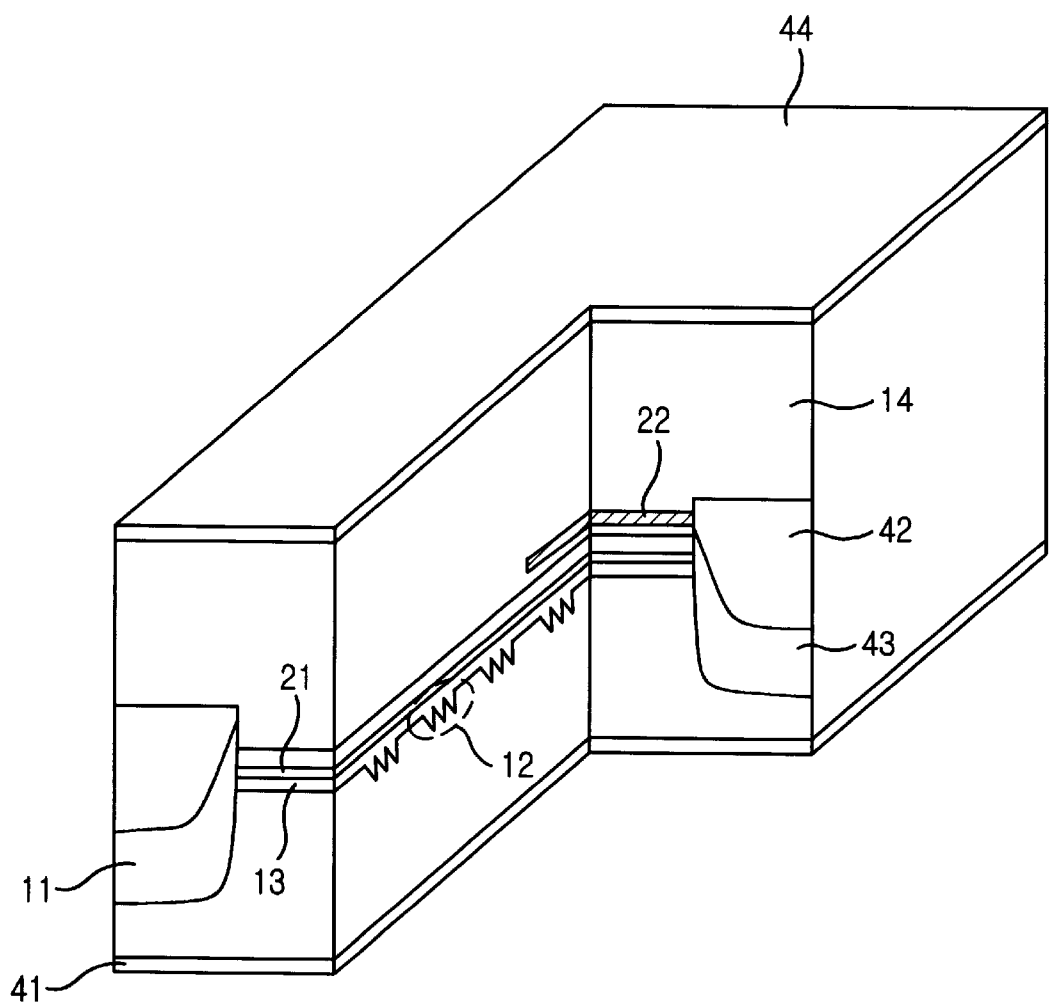
FIG. 4 provides a device cross sectional diagram of an asymmetric sampled grating single mode laser in accordance with an embodiment of the present invention.

As described above, after the procedure of forming the sampled gratings and the effective refractive index change layer, current blocking layers 42, 43 and p-type cladding layer 14 are grown, which are the same procedure as a conventional planar buried heterostructure, electrodes are deposited, and mirror facets are formed to make the laser array, as shown in FIG. 4.

In order to prove that the asymmetric sampled grating laser structure according to the present invention operates at the −1-st order reflection wavelength as designed, the reflectance curve of each section is calculated by using a transfer matrix method and a threshold gain of the laser is theoretically examined by using them. Here, the threshold gain represents a minimum optical gain at which the laser operates. The smaller the threshold gain is, the easier the laser oscillation occurs.

Figure 5A:
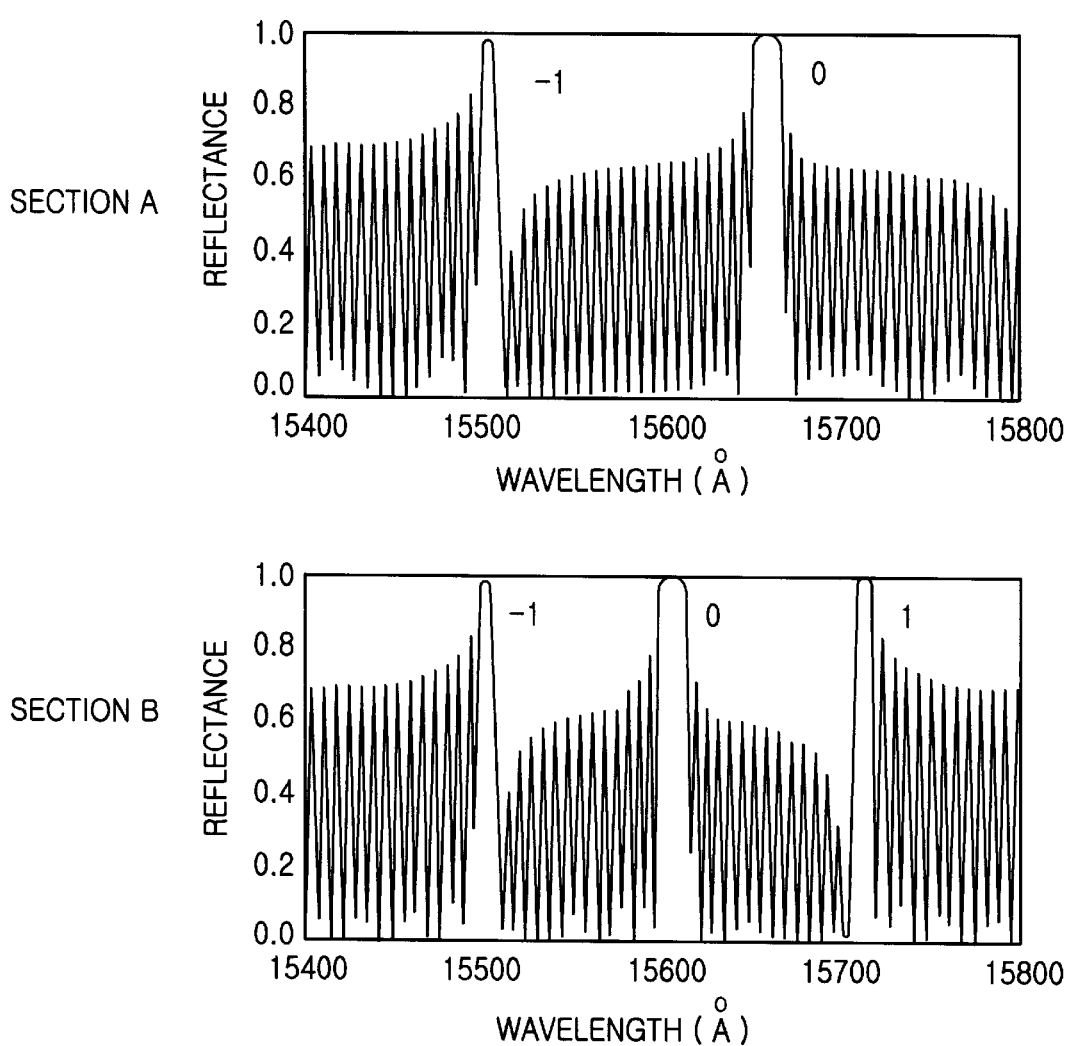
FIG. 5A is a diagram for illustrating reflectance curves from sampled gratings in sections A and B, respectively, which are calculated by a transfer matrix method.

FIG. 5A illustrates reflectance curve for the sections A and B, respectively, when the sampling periods are well adjusted. The wavelengths of the −1-st order reflection peaks at the sections A and B are matched with each other while the Bragg wavelengths are different to each other. By using this result, the threshold gain versus wavelength is calculated.

Figure 5B:
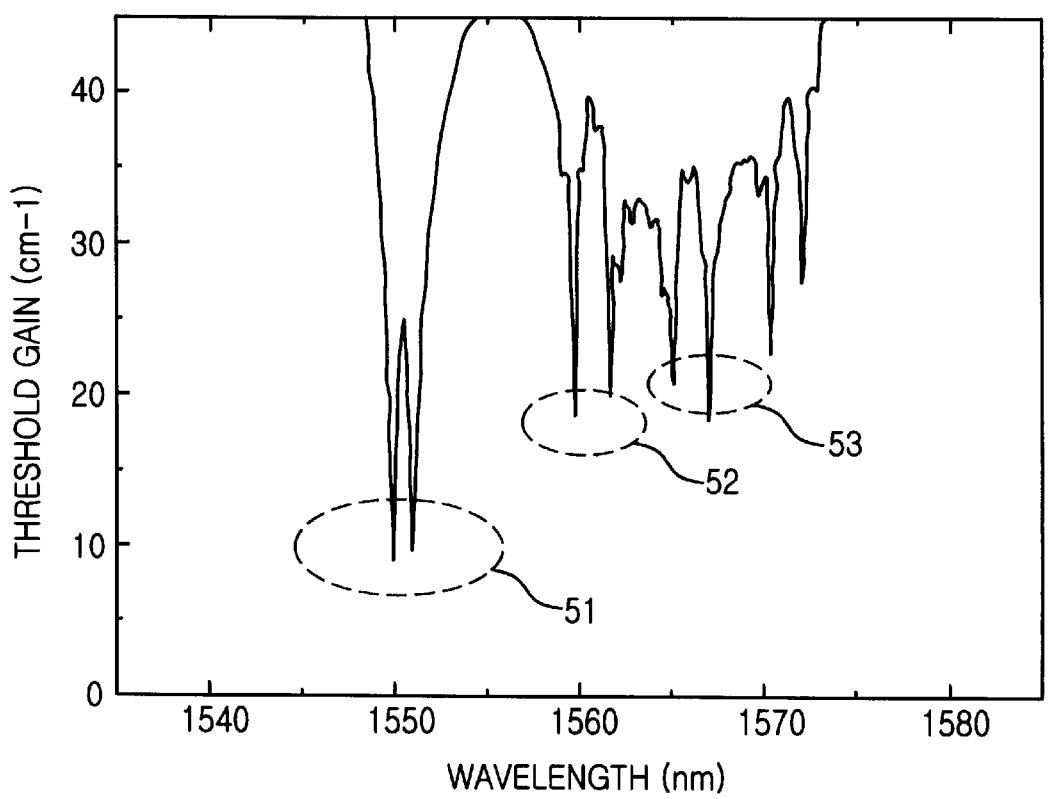
FIG. 5B is a diagram for illustrating threshold gain characteristic of an asymmetric SG single mode laser.

As shown in FIG. 5B, threshold gain for lasing operation at the −1-st order reflection wavelength 51 is less than those of the Bragg reflections of both sections A 52 and B 53.

Consequently, because the threshold gain at the −1-st order reflection wavelength is smaller than those at the Bragg wavelengths of sections A and B, the asymmetric sampled grating laser in accordance with the present invention will operates as designed.

In addition, the multi-wavelength asymmetric sampled grating laser array in accordance with the present invention may be arranged along with optical modulators so as to be implemented in the same semiconductor substrate. That is, after fabricating the array by forming a number of the multi-wavelength asymmetric sampled grating lasers in a substrate, the optical modulator array, each modulator coupled to corresponding laser across an insulating layer, are formed so as to implement a light source of an optical communication system.

As described above, the present invention implements the laser resonator by using the −1-st reflection peaks of the sampled grating so that the multi-wavelength single mode light source array can be fabricated easily and economically.

While the present invention has been shown and described with respect to the particular embodiments, it will be apparent to those skilled in the art that many changes and modifications may be made without departing from the spirit and scope of the invention as defined in the appended claims.

What is claimed is:

1. A multi-wavelength semiconductor laser array comprising:
   a substrate, wherein the substrate is divided into two sections;
   a waveguide layer formed on the substrate, wherein the waveguide layer provides a region therein;
   a plurality of active layers formed in the region in the waveguide layer;
   a multiplicity of asymmetric sampled gratings formed between the substrate and the waveguide layer, wherein sampling period of the gratings are varied according to the two sections;
   effective refractive index changing layers, formed on the waveguide layer in one section to make Bragg wavelengths of the two sections different from each other; and
   a cladding layer covering the two sections.

2. The multi-wavelength semiconductor laser array as recited in claim 1, wherein the asymmetric sampled gratings have sampling periods matched, with a $-1^{st}$ order or a 1st order reflection wavelength in the two sections.

3. The multi-wavelength semiconductor laser array as recited in claim 1, wherein the effective refractive index changing layer is formed by performing selective etching or selective area growth to change thickness of the waveguide layer.

4. A method for fabricating a multi-wavelength semiconductor laser array including gartings and active layers, the method comprising the steps of:
   (a) forming a multiplicity of diffraction gratings on a substrate, wherein each of diffraction gratings has an identical period;
   (b) forming asymmetric sampled gratings by selectively removing predetermined parts of the diffraction gratings, wherein each of the asymmetric sampled gratings has a different sampling period;

(c) forming active layers on the asymmetric sampled gratings, wherein the active layers are divided into two sections; and (d) forming effective refractive index changing layers on one of the two sections.

5. The manufacturing method as recited in claim 4, wherein, in the step (d), the effective refractive index changing layers are formed by performing selective etching or selective area growth.

6. The manufacturing method as recited in claim 4, wherein, in the step (b) of forming the asymmetric sampled gratings, the asymmetric sampled gratings are formed to have sampling periods matched with a $-1^{st}$ order or a $1^{st}$ order reflection wavelength in the two sections.

* * * * *